United States Patent [19]
Jones et al.

[11] Patent Number: 5,488,646
[45] Date of Patent: Jan. 30, 1996

[54] CLOCK DIVIDER

[75] Inventors: Anthony M. Jones, Bristol; David A. Barnes, Gloucestershire, both of United Kingdom

[73] Assignee: Discovision Associates, Irvine, Calif.

[21] Appl. No.: 409,108

[22] Filed: Mar. 23, 1995

[30] Foreign Application Priority Data

Mar. 24, 1994 [GB] United Kingdom ............... 9405806

[51] Int. Cl.$^6$ ............... H03K 21/02; H03K 21/10; H03K 3/78
[52] U.S. Cl. ............... 377/47; 377/44; 377/52; 395/550
[58] Field of Search ............... 377/44, 51, 52, 377/47; 395/550

[56] References Cited

U.S. PATENT DOCUMENTS

| 4,477,918 | 10/1984 | Nossen et al. | 377/44 |
| 4,876,733 | 11/1989 | Burch et al. | 377/52 |
| 5,289,517 | 2/1994 | Ohba et al. | 377/44 |

FOREIGN PATENT DOCUMENTS 2233132  1/1991  United Kingdom .

Primary Examiner—John S. Heyman
Attorney, Agent, or Firm—Ronald J. Clark; Robert T. Braun

[57] ABSTRACT

The invention discloses a method and an apparatus for implementing an L phase clock in conjuction with L counters, where L is an integer, to count at a frequency scalable by L.

4 Claims, 7 Drawing Sheets

CLOCK DIVIDER

REFERENCE TO RELATED APPLICATIONS

This application is related to British Patent Application entitled Clock Divider filed on Mar. 24, 1994 as U.K. Serial No. 9405806.2.

BACKGROUND

This invention relates to digital counters, and more particularly, to digital counters used to derive from a system clock one or more subsystem clocks.

Digital counters are a common component of digital systems. A typical digital system includes a system clock, and on each cycle of the system clock the counter will count. The count can be either up (e.g., from 0 to M, where M is an integer) or down (e.g., from M to 0), which ever is most convenient to implement. The counter could be programmable (e.g., M is programmable), or the counter could be hardwired (e.g., M is a single, fixed value, determined by how the counter is constructed). The counter has many applications, including timing (e.g., event timing or delay loop), and dividing down the system clock to a slowing frequency.

In general, the design of a clock is relatively straight forward. Clock design becomes tricky, however, as the desired clock frequency increases. At clock frequencies much above 10 MHZ, careful layout is needed to minimize EMI, clock skew, and other problems. At clock speeds approaching 100 MHz, these problems are even more severe, with connections between the clock and other circuit elements more resembling wave guides than simple wires.

One approach to reducing the required clock rate is to use a multiphase clock. In a multiphase clock, each clock phase operates at the same rate as the other clock phases, but out of phase with the other clock phases. With proper design, successive phases of a multiphase clock can be used to clock successive stages of a sequential logic circuit, thereby creating an effective clock rate of (no. of phases) * (clock frequency). For example, a simple two phase system clock would consist of a "clock" and its inverse, clock. Clock would be 180 degrees out of phase with clock. In a particular system, the effective clock rate of a system could be almost doubled by judicious allocation of clock and clock to clocking various logic elements. For example, a Master-Slave Flip Flop could be clocked by clocking the Master stage with clock, and clocking the Slave stage with clock.

Some digital systems require multiple clocks, operating at different clock rates or frequencies. Often the most practical approach to generating these clocks is to build a single systems clock that runs at a high enough frequency that all other clocks can be obtained by simply dividing (i.e., counting) the systems clock. A simple example is a digital system having three subsystems, one requiring a 2 MHz clock, one a 3 MHz clock, and the third a 4 MHz clock. To minimize the frequency of the systems clock, the choice of systems clock should be the least common multiple of these three subsystems clocks, or 12 MHz. The 2, 3 and 4 MHz subsystem clocks could be provided by dividing the 12 MHz systems clock by divisors of 6, 4 and 3, respectively.

While this least common multiple approach is generally adequate, the required system clock can be prohibitively high. The multiphase system clock can be divided down to produce multiphase slower clocks. In particular, each phase of a multiphase system clock can be divided down to a new clock signal, care being taken to maintain the phase relationships in tact. Alternatively, a single phase of a system clock signal can be divided down to create the new slower clock, and this slower clock then can be used to generate a multiphase clock signal at the slower clock rate.

For multiphase clocks (system or otherwise), the general case is an L-phase clock (L is an integer), with clock phases being spaced symetrically 360/L degrees apart in phase. This approach achieves a maximum possible effective clock of L times the system clock. A popular multiphase clock scheme is the quadrature clock (e.g., four phases, successive phaseses being 90 degrees apart).

Of course, there are practical limits to the number of phases into which a given clock can be split. Moreover, achieving this maximum effective clock rate requires that sequential logic elements are clocked by successive phases of the clock.

The combined multiphase, system clock approach has generally proven adequate. However, the divided subsystem clocks are limited to counting down the subsystem clock, which is 1/(Number of Phases, L) the frequency of the effective system clock. There is therefore a need for a clock divider that makes full use of the multiphase system clock to allow integer divisors of the effective system clock, rather than just integer divisors of the system clock.

More generally, there is a need for a combined clock and counter, with the clock having L phases, and the counter is capable of counting at a frequency scaled by L. There is a further need for the counter to be programmable "on the fly," and to generate an output signal that has a substantially even mark-space ration (i.e., substantially a 50% duty cycle).

SUMMARY OF THE INVENTION

The present invention is directed to a method and system for implementing an L phase clock in conjuction with an apparatus having L counters, where L is an integer, to count at a frequency scalable by L. In accordance with one aspect of the invention, a counter is clocked by a L phase system clock of frequency f, counting an integer number N. The apparatus includes L counters for counting (N–D), where D is a predetermined integer number that allows each counter to settle before N would be counted, each counting being clocked by a predetermined phase of system clock. The apparatus further includes a logic OR gate and L counter controllers, one counter controller associated with each counter, for delaying the output of their associated counter by at least D. The L counters and their associated counter controllers are arranged in series such that the input to each counter is the output of the previous counter in series delayed by the counter controller associated with the previous counter. The outputs of each counter are delayed by their associated counter controller, then are inputs to the OR gate, which ORs the outpours to form the output of the counter.

In accordance with another aspect of the invention, the counter is used to divide the clock by an integer divisor of the effective clock.

In accordance with another aspect of the invention, the counter control includes a master-slave flip flop. The master is connected to the output of the associated counter means and clocked by the clock phase clocking the associated counter means. The slave connected to the input of the OR gate, and to the next counter in series and is clocked by the clock clocking the next counter in series.

In accordance with another aspect of the invention, the clock is a quadrature clock.

Other aspects of the invention will become apparent from the following description with reference to the drawings.

BRIEF DESCRIPTION OF THE DRAWINGS

FIG. 3-1 through 3—3, collectively referred to herein as FIG. 3, are a schematic diagram of a clock divider of FIG. 1, including four counters connected in series/parallel configuration, and a counter controller associated with each counter.

DESCRIPTION OF THE PREFERRED EMBODIMENTS

Figure 1:
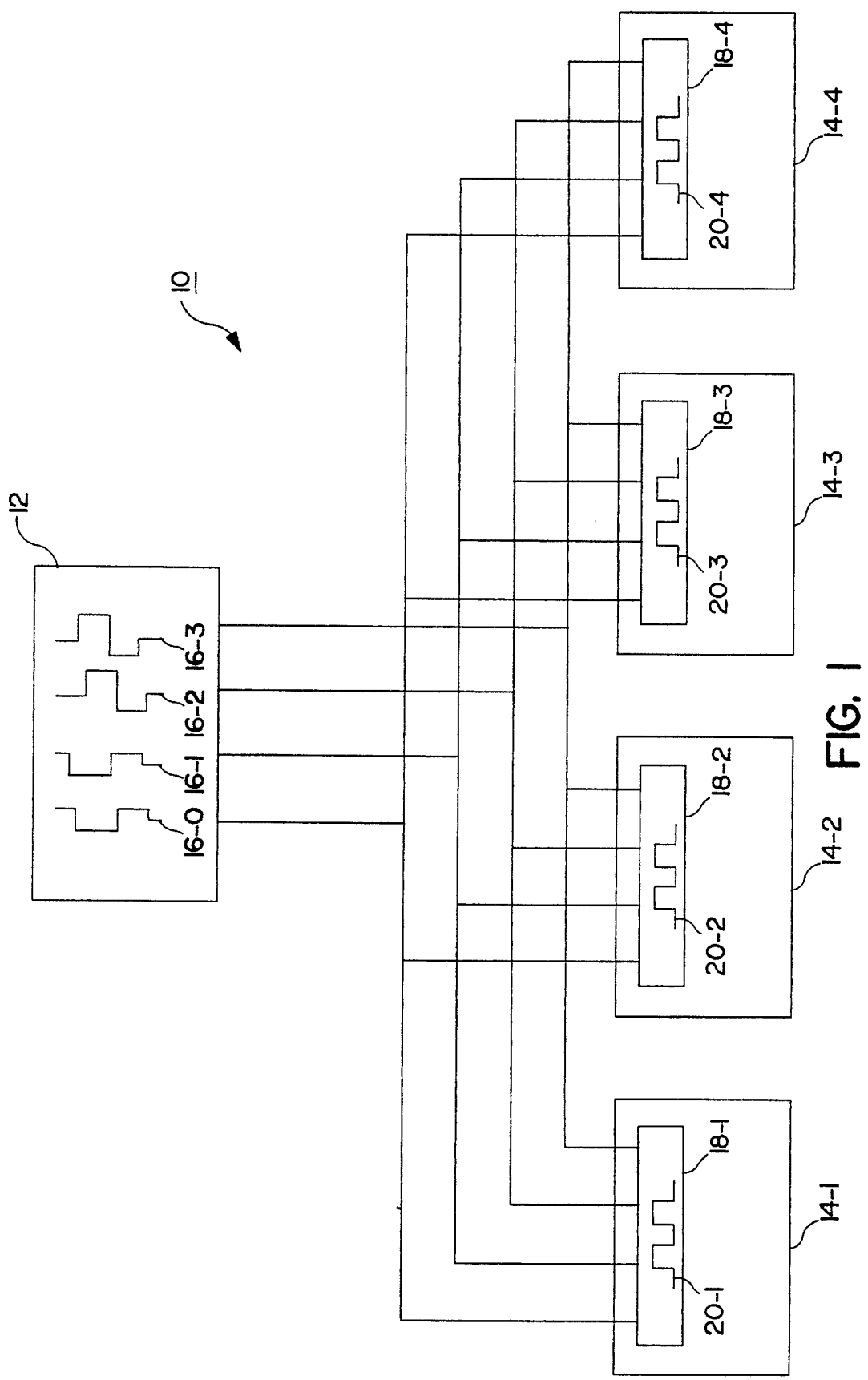
FIG. 1 is a block diagram of a digital system that effectively provides a quadrature system clock to each of four subsystems, with the subsystems each containing a clock divider, embodying the apparatus and method of the present invention, for generating subsystem clocks.
Figure 2:
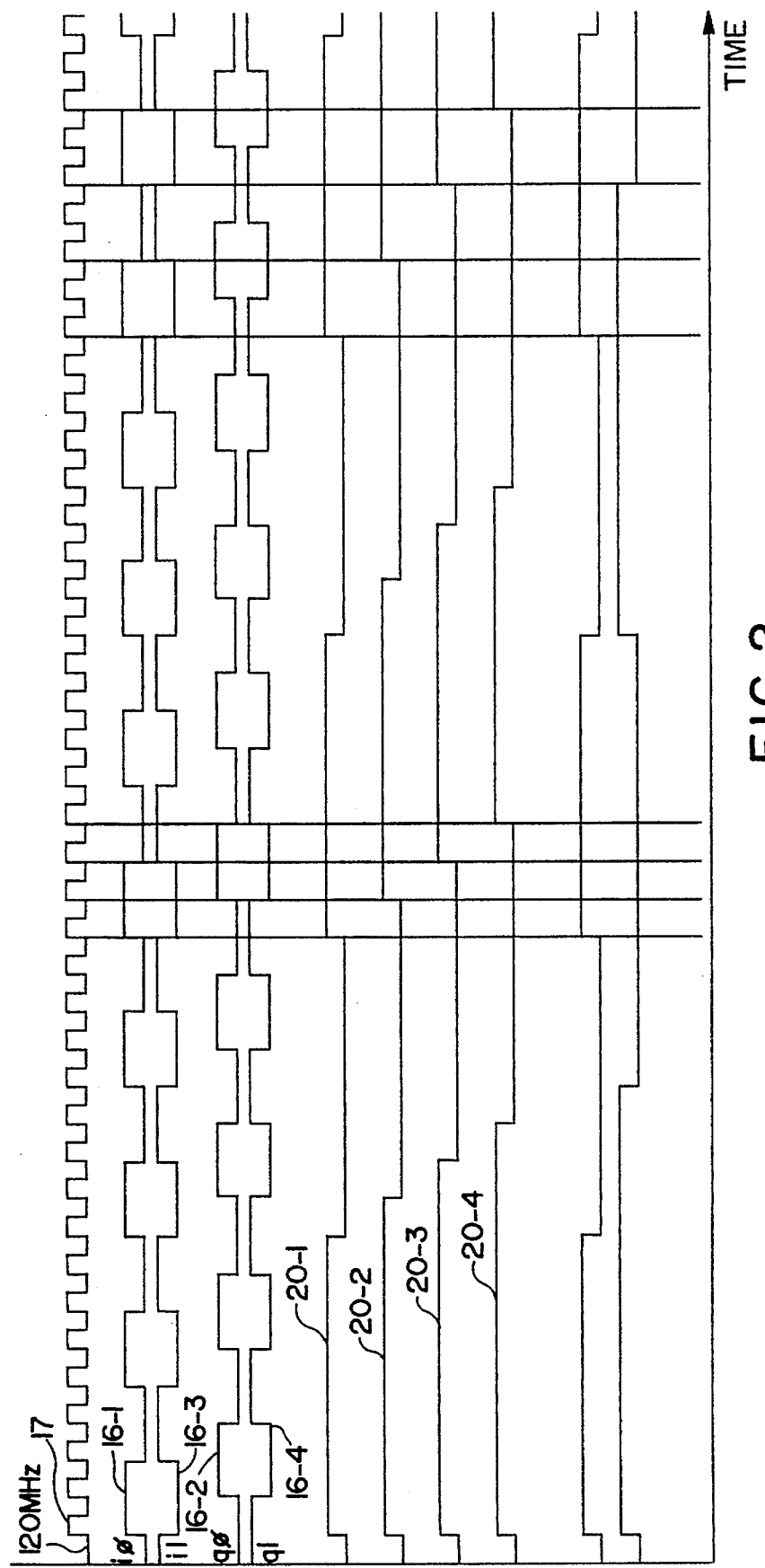
FIG. 2 is a timing diagram illustrating the relationship between the quadrature system clock, the effective system clock, and the subsystem clocks.

Referring now to FIGS. 1 and 2, there is shown in FIG. 1 a block diagram of a digital system 10. Digital system 10 includes four subsystems 14, and system clock generator 12 for generating a quadrature system clock 16, shown in FIG. 2, that is provided to subsystems For ease of analysis, shown above clock 16 is effective system clock 17, the theoretical clock rate at which circuit elements in subsystems 14 could be clocked by quadrature clock 16. Provided, that is, these circuit elements could be appropriately clocked. Note that since clock 16 is in quadrature (four phases), effective system clock 17 is four times the frequency (one-fourth the period) of system clock 16.

Subsystems 14 represent typical digital circuit elements that preferably are implemented on the same integrated circuit. Subsystems 14 are not clocked directly by system clock 16. Instead, each subsytem 14 includes a clock divider 18 that receives system clock 16, and uses system clock 16 to generate a subsystem clock 20 that runs at a slower clock rate than system clock 16. The clock divider 18 is an example of a system that uses a counter 22 embodying the present invention.

In accordance with the invention, subsysytem clocks 20 are not limited to being integer divisors of system clock 16 (i.e., integer multiples of the period of clock 16). Rather, subsystem clocks 20 can be integer divisors of effective system clock 17 (i.e., integer multiples of the period of effective system clock 17). For example, referring now to FIG. 2, the period of subsystem clock 20-1 is 4.00 times the period of system clock 16, or 16.0 times the period of effective system clock 17. The period of subsystem clock 20-2 is 4.25 (a noninteger) times the period of system clock 16, but 17 (an integer) times the period of effective system clock 17. The period of subsystem clock 20-3 is 4.50 (a noninteger) the period of system clock 16, but 18 (an integer) times the period of effective systems clock 17. Finally, the period of subsystem clock 20-4 is 4.75 (a noninteger) the period of system clock 16, but 19 (an integer) times the period of effective subsystem clock 17.

The general case for the frequencies of subsystems clocks 20 is given by the following equations: Subsystem clock 20=(Number of Phases,L)(system clock $$16)/NDATA; \quad (1)$$
$$= (Effective\ System\ Clock\ 19)/NDATA, \quad (2)$$

where NDATA is an integer that specifies the divisor for effective system clock 17.

As a matter of practical design, preferably problems of clock skew are minimized by having clock generator 12 generate only two clocks 16 that are 45 degrees out of phase: The remaining clocks 16 needed by subsystems 14 can be created locally by inverting these two clocks 16. In particular, generator 12 generates i0 clock (in-phase 0) clock 16-1 and q0 clock (quadrature 0) clock 16-2, which can be seen in FIG. 2 to lag i0 clock 16-1 by 45 degrees. Dividers 18 receive respective i0 and q0 clocks 16-1 and 16-2, and invert each to produce additional i1 (in-phase 1) and q1 (quadrature 1) clocks 16-3 and 16-4.

Figures 1, 3:
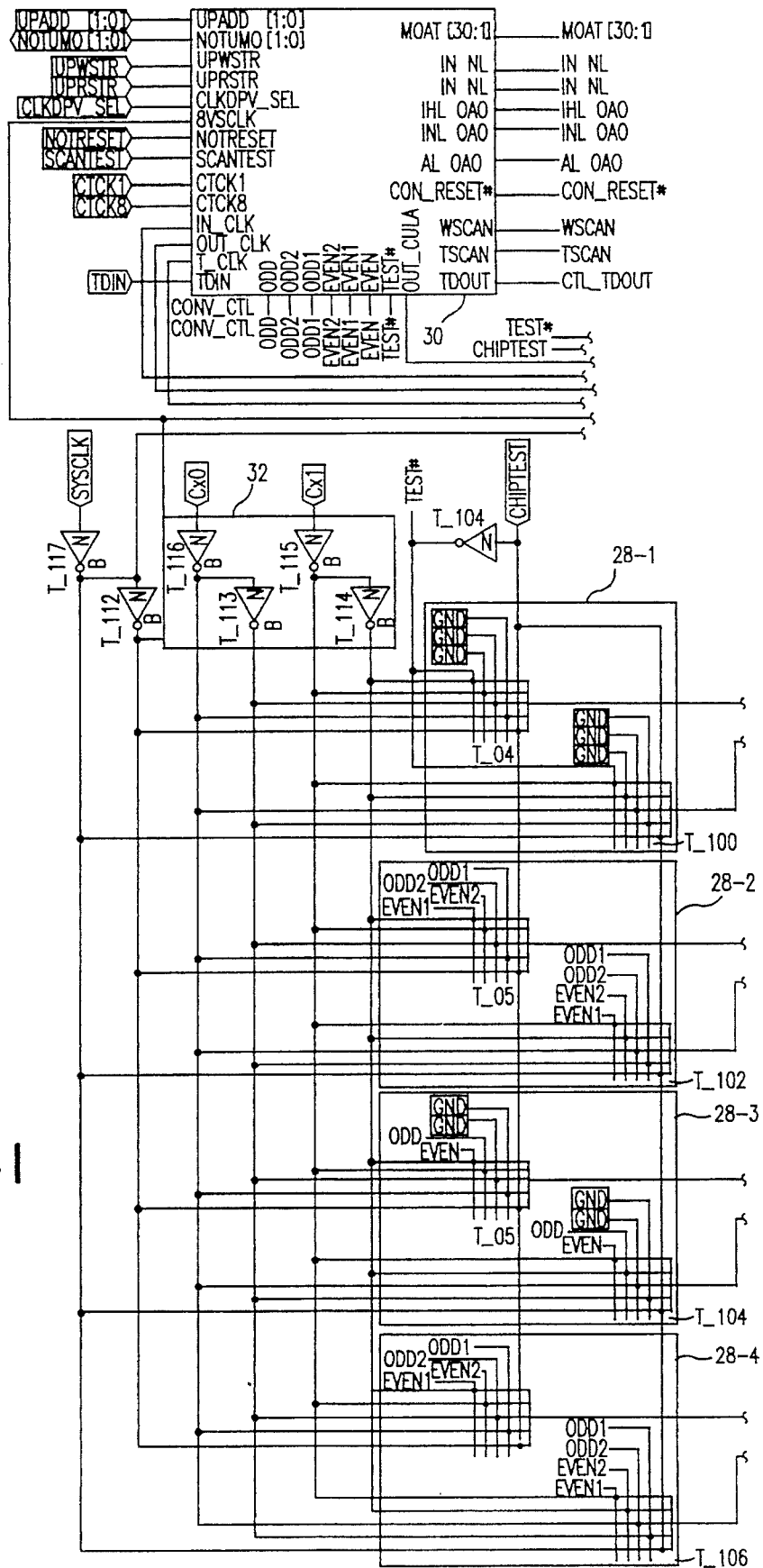
Figures 2, 3:
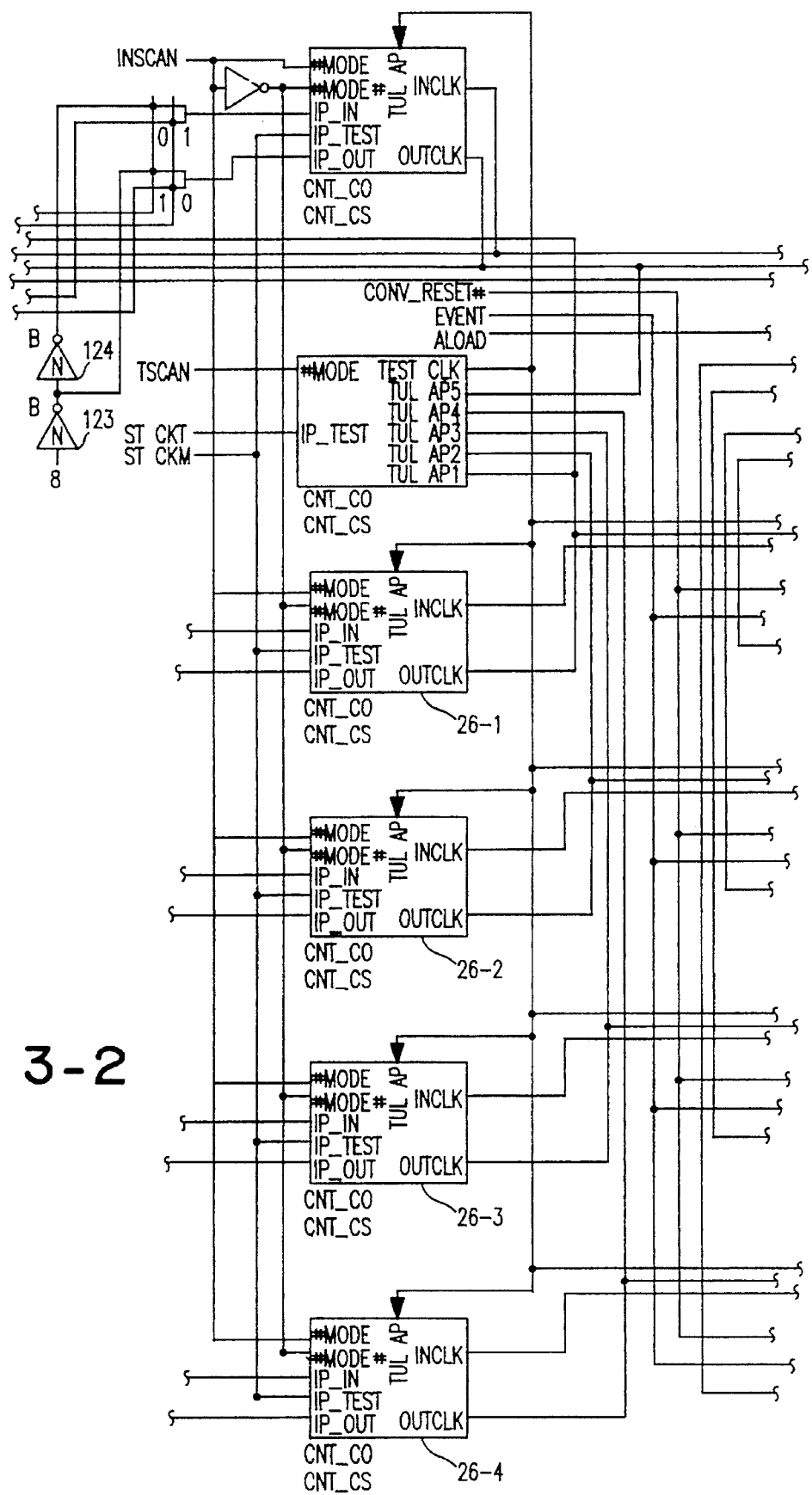
Figure 3:
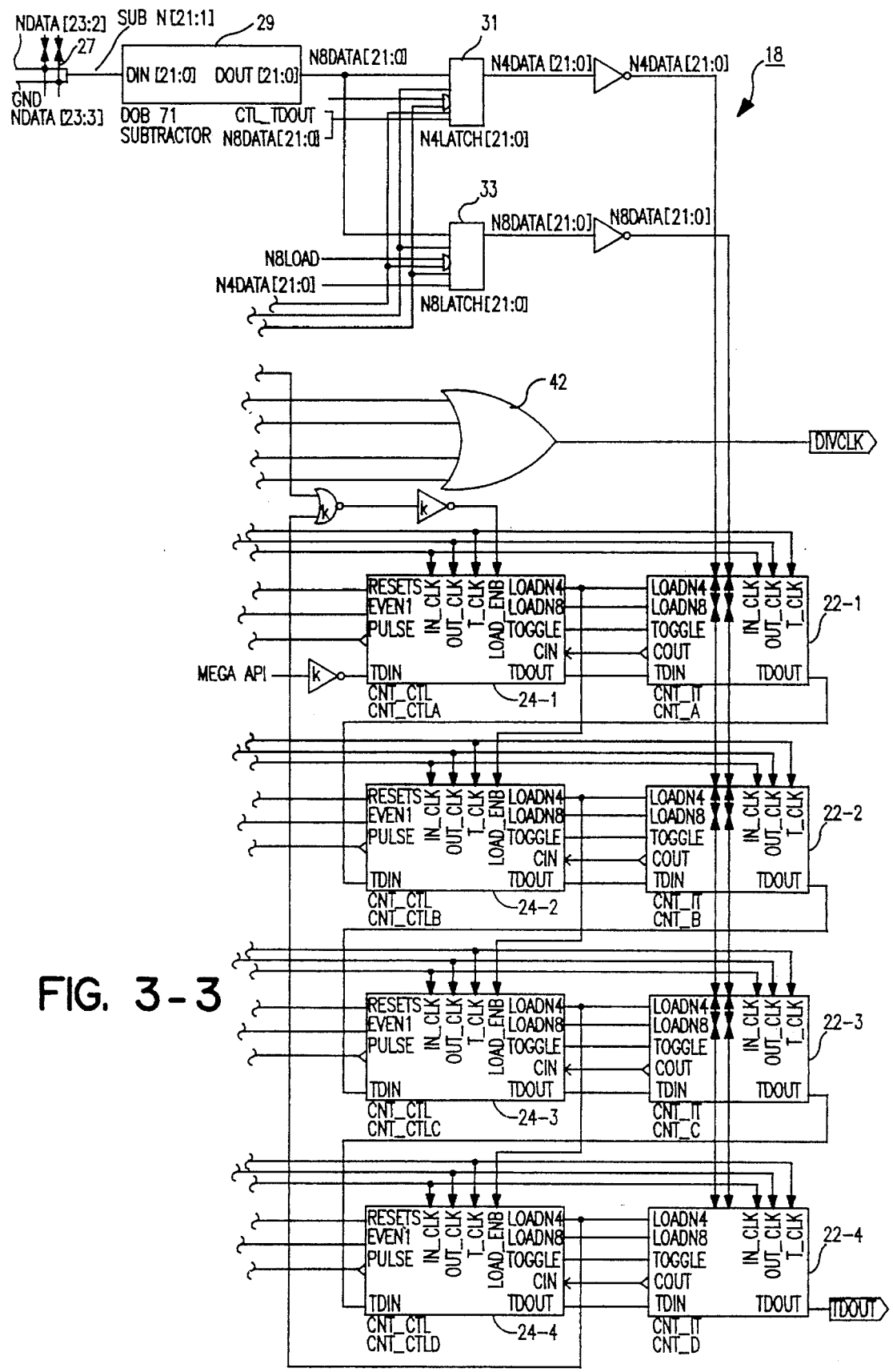

Referring now to FIGS. 1 and 3 (1–3) in FIG. 3 there is shown a simplified block diagram of a clock divider 18. Each clock divider 18 receives as inputs quadrature system clocks 16-1 and 16-2, and produces a subsystem clock 20 that is an integer divisor, NDATA, of the effective system clock rate 17. NDATA is a P-bit binary word, preferably 22 bits in width, which allows NDATA to range from 1 to $2^P=2^{22}$ (4,194,304). In this manner, digital system 10 can be clocked by a relatively fast quadrature systems clock 16, and a divider 18 can divide systems clock 16 to provide useful kHz-range subsystems clocks 20 that are useful for TV and CD player applications.

Each clock divider 18 includes four counters 22 that combine to produce subsytem clock 20. Associated with each counter 22 is a counter controller 24, a system clock buffer 26, and a system clock multiplexer 28. Each clock divider 18 further includes clock divider control logic 30, divisor selector 27, inverter/buffer 32, subtractor 29, N/4 latch 31 and N/8 latch 33.

Divisor selector 27, subtractor 29, N/4 latch 31 and N/8 latch 33 are used to load divisors (derived by subtractor 29 from NDATA) into counters 22, as discussed further below. Clock divider control logic 30 exercises overall control of clock divider 18 (e.g., control over divisor selector 27, multiplexers 28, counter controllers 24, subtractor 29, and latches 31 and 33), and preferably is itself controlled by a microprocessor (not shown). Control logic 30 also clocks latches 31 and 33.

Inverter/buffer 32 receives respective i0 and q0 system clocks 16-1 and 16-2 from clock generator 12, and in turn buffers these clocks, and also inverts these clocks to produce the remaining respective i1 and q1system clocks 16-3 and 16-4. From inverter/buffer 32, quadrature clocks 16 are connected to the multiplexers 28 associated with each counter 22. Under control of control logic 30, each multiplexer 28 switches one of four quadrature clock signals 16, through the associated clock buffer 26, to become the CLOCK IN signal to clock associated counter controller 24 and counter 22. Similarly, each multiplexer 28 also switches the inverse o of the particular clock 16 to become the CLOCK OUT signal, as discussed further herein. Clock buffers 26 not only buffer the particular clock 16 and its inverse, but also condition thses clock signals to prevent any possibility of their overlap.

Counter controllers 24 control their associated counters 22. In particular, controllers 24 control the loading of divisors (from latches 31 or 33) into their counter 22, control the counting of their counter 22, and route the output, CARRY, of their counter 22 to the appropriate locations and with the appropriate delays.

An important aspect of the invention is how counters 22 and their associated controls 24 are connected to produce subsystem clocks 20. Counters 22 are connected in an arrangement that is both serial and parallel at the same time. The parallel aspect is that subsystem clock 20 is formed, in effect, by logically ORing together the CARRY (i.e., output) of each counter 22, using four input OR gate 42. For timing reasons discussed further herein, to reach OR gate 42, each CARRY first passes through associated counter control 24, to become PULSE. When necessary, counter control 24 delays CARRY by two cycles of the quadrature clock 16 that is clocking counter control 24 and its associated counter 22.

Counters 22 are also connected together in series. The CARRY of one counter 22 serves, in effect, to trigger the input of the next counter 22 in series. The loop in the series of counters 22 is closed by having the output of counter 22-4, the last counter 22 in series, in effect triggering the input of counter 22-1, the first counter 22 in series. With proper assignment of the phase (i.e., i0, i1, q0 or q1) of quadrature system clock 16 for each counter 22 and its associated control 24, the subsystem clock 20 can have a period that is an integer multiple of the period of the effective system clock 17 (i.e., a noninteger multiple (to a fourth) of the period of the system clock 16).

In describing the serial aspect of counters 22, the caveat "in effect" is used because the CARRY is not conveyed directly to the next counter 22 in series, but instead is conveyed to the counter control 24 associated with the next counter 22 in series. The control 24 receiving the CARRY latches CARRY, and sends it on to its associated counter 22 only after an appropriate delay to allow the signal to settle into a determinate state. The appropriate delay is at least one clock 16 cycle of the particular clock 16 phase (the indeterminate period of clock 16 depends on the particular design of counters 22, but in any case is at most one period of clock 16).

As previously mentioned, counters 22 are loaded with divisors other than NDATA. NDATA would be inappropriate to load into counters 22, because NDATA is the divisor relative to effective systems clock 20, four times systems clock 16, rather than a real clock. What counters 22 actually count to produce the leading edge of subsystem clocks 20 is a divisor relative to the particular clock 16 that multiplexers 28 have connected to counter 22 and its associated control 24. This divisor is NDATA/4, one-fourth the count of NDATA.

Actually loading NDATA/4 into counters 22, however, would not achieve the desired clock 20. As previously mentioned, counter controls 24 add a delay to the count of their associated counter 22. The actual divisor loaded into counters 22 must take into account the amount of this delay. This delay is two cycles of their respective clock 16 cycles. Consequently, counters 22 are loaded with a count or divisor of NDATA/4-2.

In a preferred embodiment, subsystem clock 20 has substantially equal mark/space ratio (i.e., a 50% duty cycle). Dividers 18 produce a substantially equal mark space ratio by using counters 22 to position the trailing edge of clocks 20. The count or divisor used by counters 22 to produce the trailing edge of clocks 20 is NDATA/8-2. Note that this count also compensates for the delay introduced by control 24, a delay that allows counters 22 to settle to a determinate state before their output signal is used.

To position the trailing edge of clocks 20, control logic 30 loads NDATA/8-2 into a particular counter 22 after that particular counter 22 has generated a CARRY based on NDATA/4-2. The particular counter 22 then counts NDATA/8-2, and the subsequent CARRY is used by the associated counter controller 24 to position the training edge of the particualr clock 20.

The timing considerations mentioned above are vital to the proper operation of dividers 18. Timing problems become more accuse the greater the frequency of system clock 16. For example, a 30 MHz system clock 16 would have a period of 33.33 nS. Adjacent phases of clock 16 would be offset by one-fourth the clock 16 period, or only 8.33 nS. Symmetry of logic design becomes particularly important, since standard logic gates have typical delays of 1–2 nS, which is a significant fraction of the phase difference.

Another important issue is how control logic 30 decides which quadrature clock 16 multiplexers 28 should connect to each counter 22 (and associated counter logic 24). With four counters 22 and their associated control 24, there are many possible combinations, only some of which yield useful results for subsystem clocks 20.

In the case of a four phase system clock 16, all possible subsystem clocks 20 (resulting for NDATA>16) can be described by four combinations or categories of multiplexer 28 connections. These four categories are labeled "EVEN1, EVEN2, ODD1 and ODD2," and are listed in Table 1. For the general case of L counters 22 and L phases of clock 16, the necessary combinations can be derived by constructing an equivalent timing chart to FIG. 2, and observing for each desired divisor what combination of phases of clock 16 should be used.

Referring now to FIGS. 3 (1–3) and Table 1, control logic 30 assigns clock 16 phases by first examining NDATA to determine which of these four categories applies. Table 1 lists these categories and the phase of quadrature clock 16 associated with each category. As discussed further later, these four categories are derived from examining the relationship between the desired subsystem clocks 20 and quadrature system clocks 16. In particular, as shown in Table 1 control logic 30 assigns categories based on the two least significant bits (LSBs) of NDATA.

TABLE 1

| 2 LSB of NDATA | Category | Quad Clock 16 Phase for Counter 24-1 | Quad Clock 16 Phase for Counter 24-2 | Quad Clock 16 Phase for Counter 24-3 | Quad Clock 16 Phase for Counter 24-4 |
| --- | --- | --- | --- | --- | --- |
| 00 | EVEN1 | i0 16-1 | i0 16-1 | i0 16-1 | i0 16-1 |
| 01 | ODD1 | i0 16-1 | q0 16-2 | i1 16-3 | q1 16-4 |
| 10 | EVEN2 | i0 16-1 | i1 16-3 | i0 16-1 | i1 16-3 |
| 11 | ODD2 | i0 16-1 | q1 16-4 | i1 16-3 | q0 16-2 |

Figure 4:
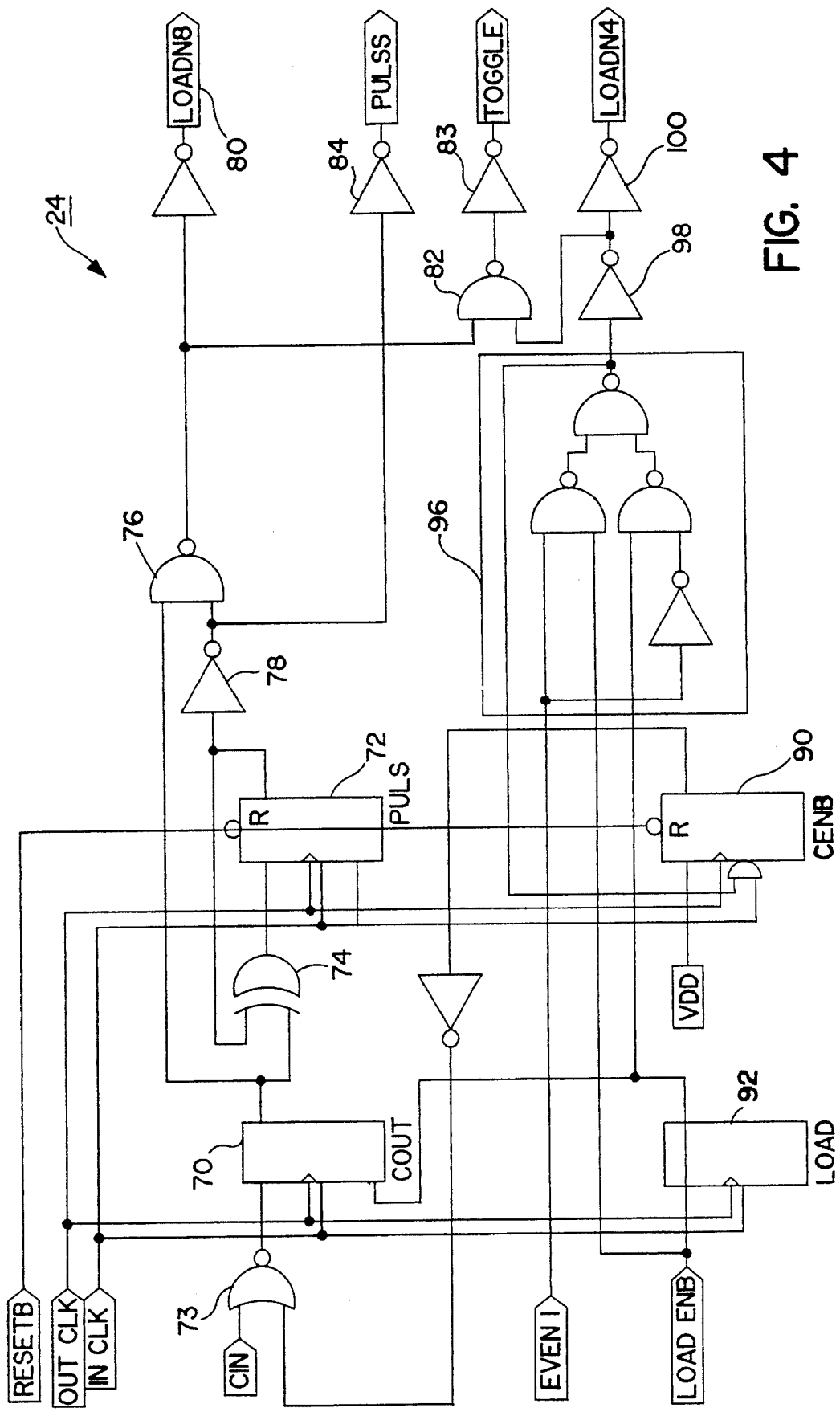
FIG. 4 is a schematic diagram of the logic of a counter controller of FIGS. 3 (1–3).

The timing considerations for counter conrol 24 to convey a CARRY to the next counter control 24 and associated counter 22 can be better understood with reference to FIGS. 3 (1–3) and 4. In FIG. 4 there is shown a more detailed schematic diagram of a counter control 24. Each control 24 contains the identical circuitry, fabricated essentially the same, in order to provide substantially identical delays and loading.

Control 24 receives three main input signals, LOAD ENB, EVEN1, and CARRY IN. A minor input signal is RESETB, which causes control 24 to reset its associated counter 22. Alternatively, counter 22 could be provided with a reset scheme that operated directly on the registers of counter 22, but this alternative would require more circuitry, and therefore more die space.

CARRY IN is the CARRY from the counter associated with control 24, the signal that control 24 will delay two cycles of the clock 16 clocking control 24. LOAD ENB in essence is the CARRY from the previous counter control 24 in series. EVEN1 is a signal from control logic 30 that identifies the EVEN1 category, a category that requires different handling than the other three 24 in series. EVEN1 is a signal from control logic 30 that identifies the EVEN1 category, a category that requires different handling than the other three categories. This category requires each counter 22 (and its associated control 24) to be clocked by the same phase of clock 16.

Control 24 outputs four main output signals, LOADN8, LOADN4, TOGGLE and PULSE. PULSE is the signal that is connected to four input OR gate 42. Preferably PULSE is the appropriately delayed CARRY signal, conditioned to have a substantially even mark/space ratio (50% duty cycle).

The remaining three output signals are commands to the associated counter 22. LOADN8 commands counter 22 to load NDATA/8 (actually NDATA/8-2, for reasons discussed above). LOADN4 commands counter 22 to load NDATA/4 (actually NDATA/4-2, for reasons discussed above). TOGGLE commands counter 22 to count. Note that these three commands are mutually exclusive. While loading a divisor, a counter 22 cannot be counting. While counting, counter 22 cannot be loading a divisor. While loading NDATA/4, counter 22 cannot be loading NDATA/8.

Referring now to FIGS. 3 (1–3) and 4, control 24 is clocked by two clocks, OUT CLK and IN CLK, received from the associated clock buffer 26. In essence, IN CLK is the system clock 16 associated with the particular counter 22 and control 24 (i.e., the clock 16 that control logic 30 has ordered the associated multiplexer 28 to provide), and OUT CLK is its inverse. Preferably clock buffer 26 also buffers clock 16 and its inverse, and modifies them so that there is no possibility of overlap between these two clocks, since they will be used to clock JK flips flops.

As part of generating its (appropriately delayed) output commands, each counter control 24 includes two JK flip flops (FFs) 70 and 72 connected in series. The input stage of FF 70 is clocked by IN CLK, and receives the output of two input NOR gate 73. One input of NOR gate is CARRY IN. The other input of NOR gate 73 is a reset signal that acts to reset counter 22. The output stage of FF 70 is clocked by OUT CLK, and connects through XOR gate 74 to the input of FF 72, and to the input of NAND gate 76.

Similar to FF 70, the input and output stages of FF 72 are clocked by IN CLK and OUT CLK, respectively. The output of FF 72 is the other input to XOR gate 74. The output of FF 72 also connects to the input of INVERTER 78. The output of inverter 78 is the other input to NAND gate 76, and is also inverted by inverter 84 to become the PULSE output signal. The output of NAND gate 76 is inverted by inverter 80 to become the LOADN8 output signal, and is an input to NAND gate 82. The output of NAND gate 82 passers through Inverter 83 to become TOGGLE.

The series combination of FFs 70 and 72 provide a delay to output signals LOADN/8, PULSE, and TOGGLE of two cycles of the particular clock 16. From a timing viewpoint, recall that the timing of this two cycle delay is vital for PULSE and for TOGGLE, since the two cycle delay compensates for the divisor actually counted by counter 22, NDATA/4-2. For LOADN8, this two cycle delay is acceptable, as will be discussed further herein.

In addition to FFs 70 and 72 and related combinational logic, control 24 includes JK FFs 90 and 92. Like FFs 70 and 72, FFs 90 and 92 are clocked by CLK IN and CLK OUT. FF 90 is used to reset counter 22. FF 92 is used to properly delay the LOAD ENB signal, which becomes LOADN4.

In contrast to the timing of the PULSE and TOGGLE signals, to properly time the LOADN4 signal, control 24 must delay the LOAD ENB signal an amount other than 2 cycles. To understand this, one must understand what the LOADN4 does, and its relationship to the other counter 24 output signals (PULSE and LOADN8).

As previously mentioned, LOADN4 causes counter 22 to load NDATA/4 (actually NDATA/4-2), the divisor that counter 22 will count to determine the leading edge of system clock 22. Obviously this divisor must be loaded into counter 22 before it can be counted. The loading process itself takes one cycle of the particular clock 16 that clocks both counter 22 and its associated control 24. For this reason control 24 must provide delay the LOAD ENB signal only one cycle of the particular clock 16.

Preferably LOADN4 is loaded into each counter 22 each time the counter 22 counts, rather than just on initialization of the counter 22. In this manner, the counting by counters 22 is by algorithm, rather than by dead reckoning, which is less subject to errors induced by alpha particles. Moreover, loading LOADN4 into each counter 22 each time the counter 22 counts enables "on the fly" programming: After a particular counter 22 finishes counting a particular divisor, the next counter 22 in series begins counting the new divisor.

The input to FF 92 is LOAD ENB. The output of FF 92 is essentially LOAD ENB delayed by one cycle of particular clock 16. This output is the input to a logic gate group 96 that has as other inputs EVEN1 and the undelayed LOAD ENB. Gate group 96 is designed such that EVEN1 functions as a control signal to switch either LOAD ENB or the one cycled delayed LOAD ENB (the output of FF 92), through two respective inverters 98 and 100, to become LOADN4.

The output of group 96 is also routed through inverter 98 to the remaining input of NAND gate 82. As previously mentioned, the other input to NAND gate 82 is the output of NAND gate 76. The output of NAND gate 82 is inverted by inverter 83 to become TOGGLE. The net effect is that TOGGLE is low whenever LOADN8 or LOADN4 are high.

Figure 5:
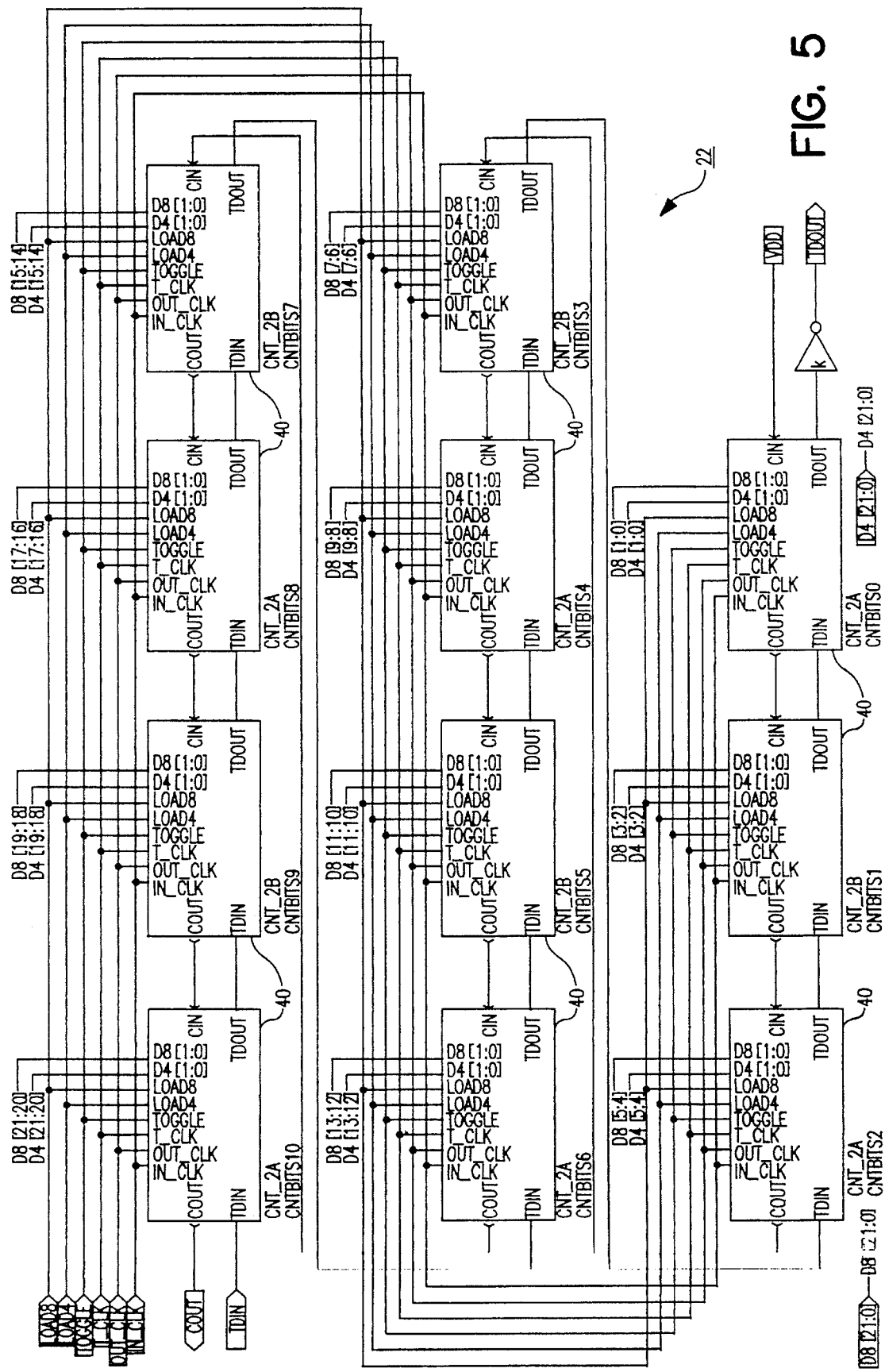
FIG. 5 is a schematic diagram of the components of a counter of FIG. 3 (1–3) showing how the counter is implemented using fast carry counters.

Referring now to FIG. 5, there is shown a schematic of how each counter 22 is implemented. Rather than counting down to zero, each counter 22 counts up from the two's complement of the number to be counted, and generates a carry when the count is completed. This approach allows each counter 22 to be implemented as a number of two-bit fast carry counters 40, an implementation that counts two to three times faster than a more traditional ripple counter. Each counter 40 is edge triggered for rapid operation.

Referring now to FIGS. 3(1–3) the divisors NDATA/4-2 and NDATA/8-2 are derived under control of control logic 30. First, the division for both is performed using MUX 27, a two input, one output multiplexer. One input to MUX 27 is simply all but the two LSB of NDATA (i.e., for divide by 4), and the other input is simply all but the three LSB of NDAT (i.e., divide by 8). The output of MUX 27 is the input to subtractor 29, which subtracts two. The output of subtractor 29 is latched to latches 31 and 33, which latch respective NDATA/4-2 and NDATA/8-2.

We claim:

1. A counter clocked by a L phase system clock of frequency f, counting an integer number N, comprising:

L means for counting (N-D), where D is a predetermined integer number that allows each L counter means to settle before N would be counted, each counting means being clocked by a predetermined phase of system clock;

L means for controlling counter means, one counter controlling means associated with each counter means, for delaying the output of their associated counter by at least D; and a means for implementing a logic OR;
wherein:
- the L counter means and their associated counter control means are arranged in series such that the input to each counter means is the output of the previous counter means in series delayed by the counter control means associated with the previous counter means; and
- the outputs of each counter means are delayed by their associated counter control means, then are inputs to the OR means, which ORs the outputs to form the output of the counter.

2. The counter of claim 1, wherein the counter is used to divide the clock by an integer divisor of the effective clock.

3. The counter of claim 1, wherein the counter control means includes a master-slave flip flop, with the master connected to the output of the associated counter means and clocked by the clock phase clocking the associated counter means, and with the slave connected to the input of the OR means, and to the input of the next counter means in series and clocked by the clock associated with the next counter means in series.

4. The counter of claim 3, wherein the clock is a quadrature clock.

* * * * *

UNITED STATES PATENT AND TRADEMARK OFFICE
CERTIFICATE OF CORRECTION

PATENT NO. : 5,488,646  
DATED : Jan. 30, 1996  
INVENTOR(S) : Anthony Jones, et al.

It is certified that error appears in the above-identified patent and that said Letters Patent is hereby corrected as shown below:

Col. 2, line 54,  
-- outputs -- in place thereof.

delete "outpours" after "the" and before "to" and insert

Col. 3, line 34, insert -- 14. -- after "subsystems" and before "For".

Col. 4, line 61, delete "o" after "inverse" and before "of".

Col. 4, line 64,  
insert -- these -- in place thereof.

delete "thses" after "condition" and before "clock" and

Col. 6, line 10,  
-- accute -- in place thereof.

delete "accuse" after "more" and before "the" and insert

Signed and Sealed this

Twenty-seventh Day of July, 1999

*Attest:*

Q. TODD DICKINSON

*Attesting Officer*　　　　*Acting Commissioner of Patents and Trademarks*